_United States Patent_ [19]

Jungkman et al.

[11] Patent Number: 4,914,299

[45] Date of Patent: Apr. 3, 1990

[54] GLASS COLD SHIELD

[75] Inventors: David L. Jungkman, Hudson, N.H.; James W. Howard, Natick, Mass.

[73] Assignee: Honeywell Inc., Minneapolis, Minn.

[21] Appl. No.: 269,121

[22] Filed: Nov. 9, 1988

[51] Int. Cl.[4] .......................... G01J 5/02; H01L 31/00
[52] U.S. Cl. ................................. 250/352; 250/370.15
[58] Field of Search ................ 250/338.1, 352, 370.15, 250/349

[56] References Cited

U.S. PATENT DOCUMENTS 3,963,926  6/1976  Borrello ..................... 250/370.15
4,431,918  2/1984  White ............................. 250/338

FOREIGN PATENT DOCUMENTS 0151728  7/1987  Japan ............................ 250/352

_Primary Examiner_—Janice A. Howell
_Assistant Examiner_—Richard Hanig
_Attorney, Agent, or Firm_—Haugen and Nikolai

[57] ABSTRACT

A shield for limiting the radiation received by an array of detectors along the length of the detector array of an electromagnetic radiation detection system to radiation provided to the detectors by the optics of the system. The shield comprises a pair of glass rods mounted in a parallel relationship to each other and to the linear direction of the array and forming an aperture along the length of the array so as to shield the elements of the array from electromagnetic radiation generated outside the field-of-view of the detectors.

8 Claims, 1 Drawing Sheet

GLASS COLD SHIELD

BACKGROUND OF THE INVENTION

The present invention relates a novel approach to shielding undesirable background electromagnetic radiation from radiation detectors operating in the infrared (IR) region of the energy spectrum. These IR radiation detectors and the background shields, called cold shields, operate at reduced temperatures so that the cold shield not only prevents warm background radiation from arriving at the radiation detector but itself does not emit radiation in the band seen by the radiation detector either. The novel approach departs from the common techniques used in the design of these cold shields without limiting detector performance.

DISCUSSION OF THE PRIOR ART

It is generally recognized that for effective cold shielding, a cold shield should be positioned as far from the detector as possible within limits of the system envelope. To be more specific, the aperture of the cold shield should be at least ten times the detector width above the detector. In prior art, where the detectors were 0.004 to 0.008 inches wide, the cold shields were 0.040 to 0.080 inches above the detector. Since the size of the aperture is determined by the detector field-of-view and the distance above the detector, these cold shields are relatively massive. A typical field-of-view for a 0.006 inch wide detector may be 45°. At a distance of 0.060 inches from the detector, the aperture of the cold shield would be 0.060 inches. The structure of this cold shield must be made of good thermal conductor, such as metal or alumina ceramic, so that radiant heat absorbed by the cold shield will be conducted to the cooling means while maintaining a temperature at the aperture near that of the detector.

The IR detectors commonly are arranged along a line where the detector spacing is of the order of the detector width. Detector arrays comprised of 60 to 180 elements in a straight line are typical. The cold shields described above provide minimal cold shielding in the direction of the line of detectors. The cold shield cannot interfere with or block any part of the detector's field-of-view and the fields-of-view overlap each other very near the plane of detectors so the aperture of the cold shield takes on the shape of a slot. A device called an individual or proximal cold shield has been developed which mounts directly on the linear detector array to provide moderate cold shielding between elements along the line of detectors. This individual cold shield is about 0.004 inches thick and has individual holes for the detectors to "look" through. The web between the holes in the cold shield and up 0.004 inches above the detector plane provides the cold shielding. This device is typically made of silicon or as described in U.S. Pat. No. 4,431,918 to William J. White (hereinafter "White") of etchable glass.

The art of IR detector technology has progressed. The detector size has decreased and their complexity has increased. However, the art of cold shielding has not kept pace with detector technology. The present invention makes a radical departure from the current state-of-the-art of detector cold shielding technique. Detector size is now commonly 0.001 to 0.002 inches wide. Therefore, the aperture of the cold shield need only be 0.010 to 0.020 inches above the detector for effective cold shielding and the aperture width, with the same 45° field-of-view, would be 0.010 to 0.020 inches. The material of the cold shield no longer needs to be a good thermal conductor in order to maintain temperature near the detector because the size and mass of this cold shield is greatly reduced and the absorbed thermal radiation is also greatly reduced. The size and mass of the previous art cold shield required mounting it to the cooling means along side the detector chip. The size and mass of the present invention is small enough to permit mounting the cold shield directly on the detector chip or the individual cold shield.

SUMMARY OF THE INVENTION

The present invention is a shield for limiting the radiation received by an array of detectors of an electromagnetic radiation detection system to the radiation provided to the detectors by the optics of the system. The shield comprises a pair of glass rods mounted in a parallel relationship forming an aperture along the length of the detector array so as to shield the elements of the array from interfering electromagnetic radiation generated outside the field-of-view of the detectors as provided by the optics.

It is one object of the invention to provide a glass cold shield with a reduced mass and surface area resulting in reduced cool down time and less cooling energy or gas consumption than prior art shields.

It is another object of the invention to provide a glass cold shield which is comprised of a readily available, economical material.

It is another object of the invention to provide a cold shield which is easily assembled by bonding to either an individual cold shield or directly onto the detector array without special fixtures or tools.

It is yet another object of the invention to provide an electromagnetic radiation detection system including an improved glass cold shield.

It is yet a further object of the invention to provide a cold shield comprised of a glass material which absorbs infrared wavelengths, thereby improving the sensitivity of infrared sensing systems.

Other objects, features and advantages of the invention will become apparent to those skilled in the art through reference to the detailed description of the preferred embodiment, claims and drawings herein wherein like numerals represent like elements.

DESCRIPTION OF THE PREFERRED EMBODIMENT

Figure 1:
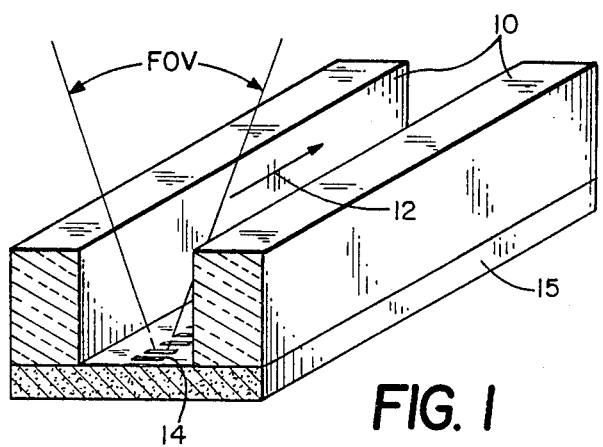
FIG. 1 schematically illustrates an electromagnetic radiation of thermal energy detection system including the glass cold shield of the invention.
Figure 3:
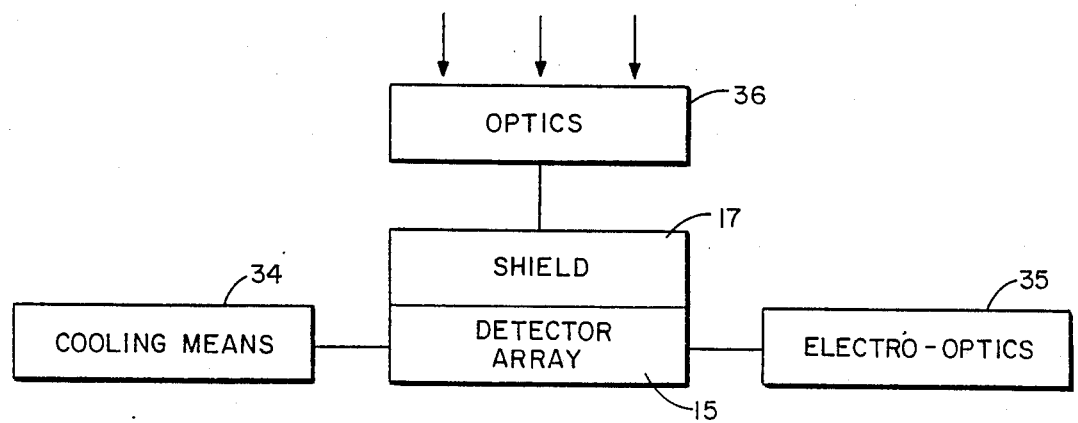
FIG. 3 is a block diagram of an infrared or other electromagnetic energy detection system.

Referring now to FIG. 1, an electromagnetic radiation of thermal energy detection system employing the glass cold shield of the invention is shown. The system shown in FIG. 1 comprises a detector array 15 having a plurality of electromagnetic radiation detectors 14 and having mounted thereon two glass rods 10 which are positioned so as to shield the array of detectors from electromagnetic radiation generated outside of the detector's field-of-view as shown in FIG. 3. The detectors 14 may be comprised of any thermal sensitive material such as mercury cadmium telluride mounted on a suitable base or substrate material such as silicon. The detector field-of-view, established by the optics of the system, is a cone of desirable radiation which is collected from a target area. Any radiation originating outside of this field-of-view is undesirable and will interfere with the operation of the detectors in, for example, an infrared detection system. The glass rods 10 are positioned so as to allow the incoming radiation within the detector's field-of-view to pass through to the detector while blocking as much of the interfering radiation as possible. The glass rods 10 are aligned in a parallel relationship forming an aperture or channel along the direction of the array as indicated by arrow 12 in FIG. 1. Thus, the glass cold shield will block interfering background radiation along the length of the detector array.

Figure 2:
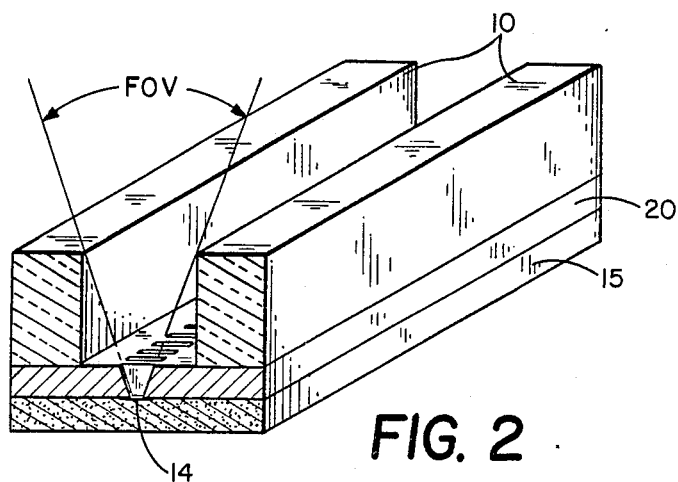
FIG. 2 schematically illustrates the arrangement of FIG. 1 with further shielding being provided by an individual cold shield.

An alternative embodiment of the invention as shown in FIG. 2 wherein the glass cold shield of the invention formed by the pair of glass rods 10 is mounted directly onto an individual cold shield 20 which is, in turn, mounted on the detector array 15. The glass cold shield cooperates with the individual cold shield 20 in order to improve the shielding of the detectors both along the direction of the array and individually. The individual cold shield, often called a proximal cold shield, is typically comprised of a silicon material and is manufactured according to methods well known in the art. The function of the individual cold shield is to shield each individual detector by blocking radiation between the detector elements. A typical individual cold shield may be about 4 mils thick.

Referring again to FIGS. 1 and 2, in the preferred embodiment of the invention, the glass cold shield must have a sharp edge on the order of about 0.001 inches radius. In the embodiment shown in FIG. 2, it is mounted closely to the detector array, typically in the range of 0.015 to 0.025 inches. Such a sharp edge can be achieved using a standard dicing saw, for example or other similar glass cutting equipment. The glass cold shield may be cut from a standard sheet of glass using such standard sawing equipment. The cost of the cold shield is, therefore, quite minimal. In the preferred embodiment of the invention, the glass cold shield is bonded directly to the individual cold shield or to the detector array itself using well known bonding techniques and materials. This may be done without expensive fixtures or special tools because the detector array, in one embodiment of the invention, will be in the field-of-view of a microscope of the type typically used during manufacture of such detectors.

The glass cold shield of the invention is much smaller than existing metal slot shields. The mass and surface area (i.e., radiation heat load) is also less than existing slot shields. In one illustrative example of the embodiment, the mass reduction gained was from 0.36 grams for an existing slot shield to 0.0046 grams for the glass cold shield. Further, in one illustrative embodiment of the invention, the surface area required for the glass cold shield was reduced by 0.1 square inches as compared to known slot shields used in similar devices. This reduction in mass and surface area further reduces cool down for the system and thereby less $N_2$ gas consumption is required.

Having described in detail the preferred embodiment of the invention, we now turn to its application in a typical electromagnetic sensing system such as an infrared system. As is illustrated in FIG. 3, such a system normally includes optics 36 for viewing electromagnetic radiation, the optics provide a view of the scene (optics 36 could include an optical scanner; alternatively, the system could employ starring sensors. The system also includes an array 15 of detectors mounted at the focal plane of the optics for producing electrical signals representative of the radiation impinging on the detectors. In accordance with the present invention, such a system also includes a shield 17 comprising a pair of glass rods mounted in a parallel relationship forming an aperture along the direction of the array so as to shield the elements of the array from interfering electromagnetic radiation generated outside the field-of-view of the detectors. The system also includes cooling means 34 for the detector array and the shield. Electro-optics 35 coupled to the electrical output of the detector array provide electrical signals which form a display of the scene viewed by the optics. Except for the glass cold shield of the invention comprised of the two glass rods 10, all of the other elements shown in FIG. 3 are well known in the art and may be made in various configurations as will be recognized by one skilled in the art.

The present invention is to limited only in accordance with the scope of the appended claims since persons skilled in the art will devise other embodiments or processes still within the limits of the claims.

We claim:
1. An electromagnetic radiation detection system comprising:
  (a) optics for viewing a scene, the optics providing a field-of-view of the scene;
  (b) a linear array of detectors mounted in the path of the field-of-view of the optics for producing electrical signals representative of electromagnetic radiation impinging on the detectors;
  (c) a shield comprising a pair of glass rods mounted in a parallel relationship to each other and to the linear array of detector elements so as to shield the array from interfering electromagnetic radiation generated outside of the field-of-view of the detectors along the length of the array;
  (d) cooling means for the array of detectors and the shield; and
  (e) electro-optics coupled to the electrical output of the array for forming a display of the scene viewed by the optics.

2. Apparatus according to claim 1 further including an individual cold shield mounted between the detector array and the glass shield.

3. The invention of claim 1 wherein the glass cold shield is mounted in the range of about 0.015 to 0.025 inches from the detector array.

4. The apparatus of claim 1 wherein the detectors are comprised of mercury cadmium telluride.

5. A cold shield for use in an infrared detection system having a linear array of detector elements comprising a pair of glass rods mounted in a parallel relationship forming an aperture along the length of the array so as to shield the elements of the array from interfering electromagnetic radiation.

6. An electromagnetic radiation detection system comprising:
  (a) optics for viewing a scene, the optics providing a field-of-view of the scene;

(b) a linear array of detectors mounted in the path of the field-of-view of the optics for producing electrical signals representative of electromagnetic radiation impinging on the detectors;

(c) a shield comprising an individual cold shield between the array elements mounted to the detector array for blocking radiation outside the detector field-of-view;

(d) a shield comprising a pair of glass rods mounted in a parallel relationship to each other forming an aperture along and parallel to the length of the detector array so as to shield the array from interfering electromagnetic radiation outside of the field-of-view of the detectors;

(e) cooling means for the array of detectors and the shield; and (f) electro-optics coupled to the electrical output of the array for forming a display of the scene viewed by the optics.

7. The apparatus according to claim 6 wherein the detectors are infrared detectors.

8. The apparatus according to claim 7 wherein the detectors comprise mercury cadmium telluride.

* * * * *